United States Patent
Ba-Tis et al.

(10) Patent No.: US 10,608,557 B1
(45) Date of Patent: Mar. 31, 2020

(54) FOUR DEGREES OF FREEDOM PISTON-TUBE ELECTROSTATIC ACTUATOR

(71) Applicants: Faez Ba-Tis, Toronto (CA); Ali Banss, Toronto (CA); Ahmed Galaom, Toronto (CA); Ridha Ben-Mrad, Toronto (CA)

(72) Inventors: Faez Ba-Tis, Toronto (CA); Ali Banss, Toronto (CA); Ahmed Galaom, Toronto (CA); Ridha Ben-Mrad, Toronto (CA)

( * ) Notice: Subject to any disclaimer, the term of this patent is extended or adjusted under 35 U.S.C. 154(b) by 0 days.

(21) Appl. No.: 16/229,680

(22) Filed: Dec. 21, 2018

(51) Int. Cl.
*H02N 1/00* (2006.01)
*B81B 3/00* (2006.01)

(52) U.S. Cl.
CPC ........... *H02N 1/008* (2013.01); *B81B 3/0051* (2013.01); *B81B 3/0062* (2013.01); *B81B 2203/0136* (2013.01)

(58) Field of Classification Search
CPC .... H02N 1/008; B81B 3/0051; B81B 3/0062; B81B 2203/013
USPC .................................................. 310/300, 309
See application file for complete search history.

(56) References Cited

U.S. PATENT DOCUMENTS

| 9,306,475 B1* | 4/2016 | Ba-Tis | .................. H02N 1/008 |
| 2004/0149035 A1* | 8/2004 | Acar | ..................... B81B 3/0062 |
| | | | 73/504.12 |

* cited by examiner

*Primary Examiner* — Thomas Truong
(74) *Attorney, Agent, or Firm* — Nasser Ashgriz; UIPatent Inc.

(57) ABSTRACT

A MEMS electrostatic piston-tube actuator that provides 4 degrees of freedom (4-DOF) motion is disclosed. The actuator comprises of an inner and an outer MEMS structure. The inner MEMS structure comprises of an inner moving stage (rotor) and an inner fixed frame (stator). The inner rotor comprises of a central load stage, a plurality of rotary comb drive electrodes surrounding the central rotor. The outer MEMS structure comprises of an outer moving stage (outer rotor) and outer stator frame. The outer rotor holds the entire inner MEMS structure and is rigidly attached to it through a fixed periphery of the inner MEMS structure. The outer rotor comprises of a plurality of through openings (tubes) and attached to a fixed outer periphery through a plurality of mechanical springs. A load set on the central stage can be controlled in 4-DOF comprising of translational and rotational motions of roll, yaw, pitch, and z-axis translation.

11 Claims, 14 Drawing Sheets

FOUR DEGREES OF FREEDOM PISTON-TUBE ELECTROSTATIC ACTUATOR

FIELD OF THE INVENTION

The invention relates to the field of MEMS electrostatic actuators that provide large forces and are able to translate and rotate large masses. Such actuators could be used in the field of miniature cameras to achieve autofocus (AF) and/or optical image stabilization (OIS) to counteract hand-shaking motion.

BACKGROUND OF THE INVENTION

Different types of MEMS electrostatic micro-actuators have been used to achieve Autofocus (AF) and Optical Image Stabilization (OIS) in miniature cameras. U.S. Pat. No. 9,264,591B2 discloses a MEMS electrostatic actuator to achieve OIS and AF by providing a multiple degrees of freedom (DOF) motion to move the image sensor. The actuator also utilizes mechanical flexures/springs between the driving comb electrodes and the load stage for the purpose of amplifying the rotational strokes and to reduce the coupling effect between motion along different axes. Such a structure, having elastic flexures between the load and driving electrodes, significantly reduces the electrostatic forces acting on the load. It also introduces a mechanical coupling between different motions as one set of springs (i.e. four mechanical springs) are responsible to move a single load along multiple axes.

Another MEMS electrostatic actuator that is used to achieve OIS in miniature cameras is presented in U.S. Pat. No. 9,578,217B2. The actuator is able to move the image sensor along 3-DOF in-plane motion, i.e., translation along the x and y axes and rotation about the z-axis to achieve OIS. The actuator is not able to provide yaw motion (rotation about the x-axis) and pitch motion (rotation about the y-axis) to the image sensor. It has been reported that providing yaw and pitch motion to the optical image sensor or the entire module is the best way to counteract the hand-shaking rotation components (yaw and pitch).

SUMMARY OF THE INVENTION

The present invention discloses a 4 degrees-of-freedom (DOF) electrostatic microactuator that is able to provide roll (rotation about z-axis), yaw (rotation about the x-axis), pitch (rotation about the y-axis), and translation along the z-axis (i.e., optical axis). The actuator utilizes an electrode configuration that enables large force generation to actuate the load. The actuator is fabricated using the bonding of two Si plates, i.e. upper and lower. The actuator contains two main structures, i.e. an inner MEMS structure (provides roll motion) and an outer MEMS structure (provides yaw, pitch, and z-translation motion).

The inner MEMS structure consists of an outer moving stage (inner rotor) and four inner stators. Both inner rotor and the four inner stators are formed from the thicknesses of the upper and lower plates. The rotor consists of a central stage, for load placement, and a plurality of moving rotary comb electrodes with each containing a number of circular fingers. The central stage and the moving rotary comb fingers are attached to an inner fixed periphery frame of the inner MEMS structure via four mechanical springs. Each of the four inner stators consists of a support base containing a plurality of vertical support columns that hold fixed rotary combs. The support base and the vertical support columns are formed from the thickness of the lower plate and the fixed rotary combs are formed from the thickness of the upper plate. The goal of the vertical support columns is to hold the fixed rotary combs so that they are at the same level of the moving rotary combs in the rotor and to provide an electrical connection to each fixed rotary comb. In the presence of a potential difference, the fingers of the moving rotary combs interdigitate with the fingers of the fixed rotary comb electrodes due to the electrostatic forces developed between both fixed and moving combs. Each opposing pair of the inner stators has the same electrical polarity such that they drive the inner rotor in a bi-directional roll motion about the z-axis.

The outer MEMS structure of the 4-DOF MEMS electrostatic piston-tube actuator consists of an outer moving stage (outer rotor) and four outer stators. The outer rotor holds all parts of the inner MEMS structure (inner rotor and outer four stators) and contains a plurality of openings (tubes or apertures) made in the thickness of the upper plate. The outer rotor—containing openings and holding the inner MEMS structure—is attached to an outer fixed periphery of the outer MEMS structure of the actuator. Each of the four outer stators consists of a support base that holds vertical pillars called pistons. Each piston in the outer stators is vertically aligned with a tube or aperture in the outer rotor such that they engage with each other in the presence of a potential difference. By applying different voltage signals to the outer stators, the outer rotor (holding the inner MEMS structure) moves along the 3-degrees of freedom motion (i.e. yaw, pitch, and z-axis translation), leading to 4-DOF motion of the load placed on the central stage.

The novel design has number of advantages including providing large forces to move the load as the driving electrodes (rotary combs in the inner MEMS structure and pistons and tubes (apertures) in the outer MEMS structure) cab be multiplied along the x-y plane. The actuator structure also allows the transmission of the force from the driving electrodes directly to the load placed on the central stage. Therefore, no reduction in the amount of force acting on the load which occurs when mechanical flexures between the driving electrodes and the load stage are used. In addition, the present invention offers a high stiffness structure where the moving stages (inner and outer rotor) have a ribbed structure or porous structure such that it contains no hanging comb drive supports. In other words, all moving combs are supported from two sides unlike the conventional rotary comb structures where the fingers are supported from one end and free from the other end. The piston-tube electrode configuration has numerous advantages that are explained in detail in a previous patent by the authors (U.S. Pat. No. 9,306,475B1) which is incorporated here in its entirety. The present invention provides a mechanical decoupling between the inner rotor (providing roll motion) and the outer rotor (providing pitch, yaw, and z-translation motion); such decoupling is preferred in the motion control of the actuator.

BRIEF DESCRIPTION OF DRAWINGS

Embodiments Herein Will Hereinafter be Described in Conjunction with the Drawings Provided to Illustrate and not to Limit the Scope of the Claims, Wherein Like Designations Denote Like Elements, and in which:

FIG. 1F illustrates an exploded view of FIG. 1A that shows the two plates that the actuator is made of.

DETAILED DESCRIPTION OF THE INVENTION

Figure 1A:
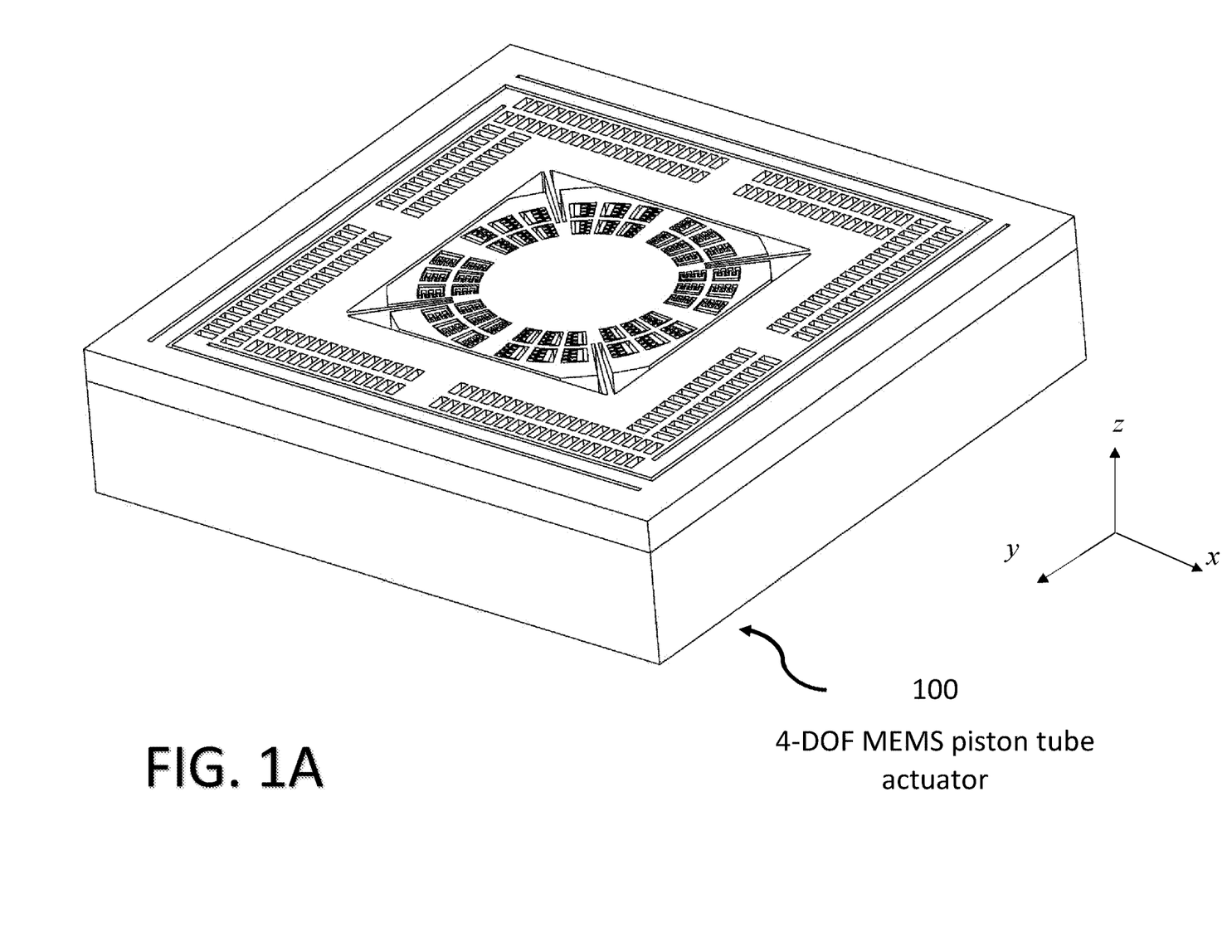
FIG. 1A shows a perspective view of a the 4-DOF MEMS piston-tube electrostatic actuator.
Figure 1B:
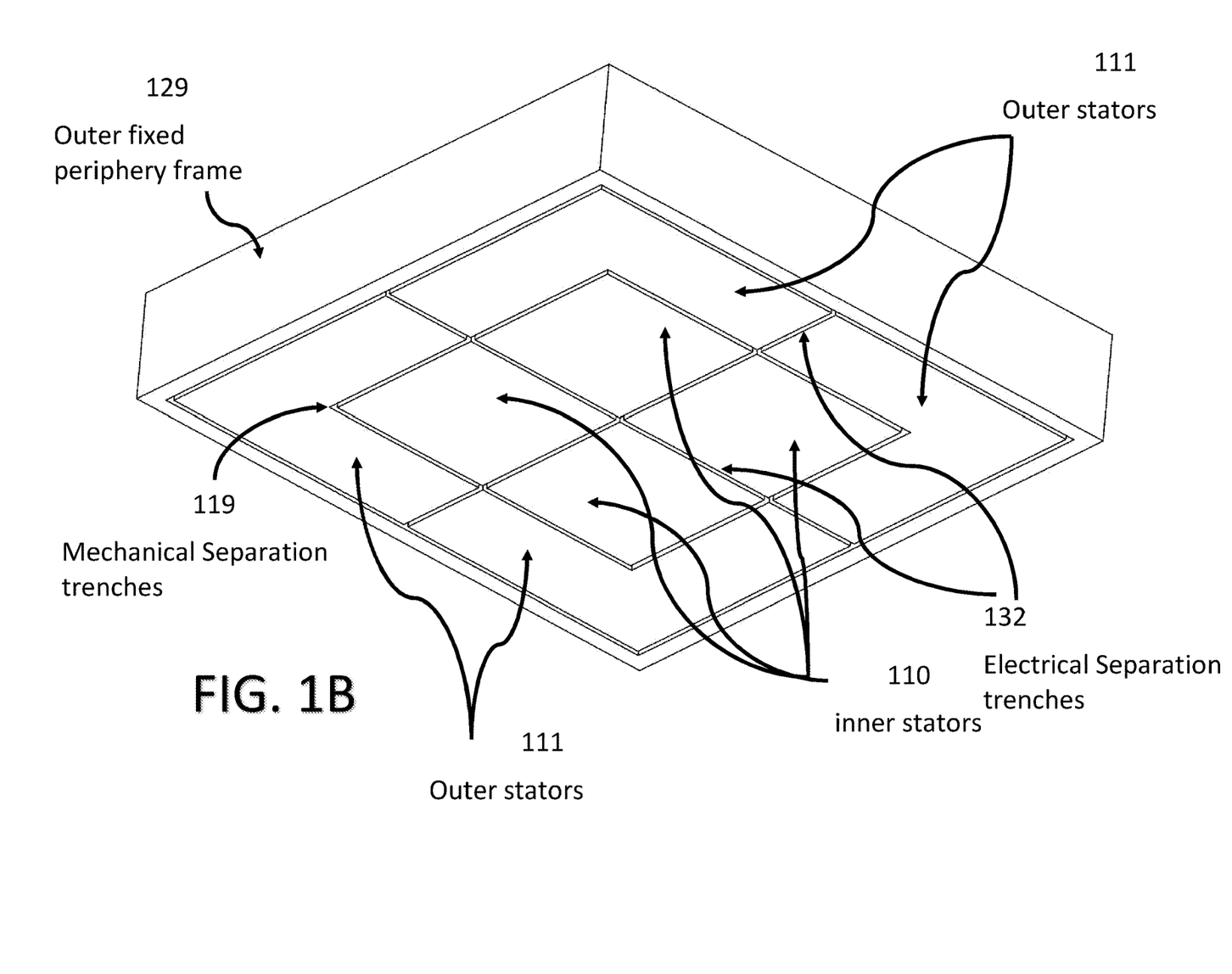
FIG. 1B illustrates a perspective view of the eight stators of the inner and outer MEMS structures of the 4-DOF MEMS piston-tube electrostatic actuator.
Figure 1C:
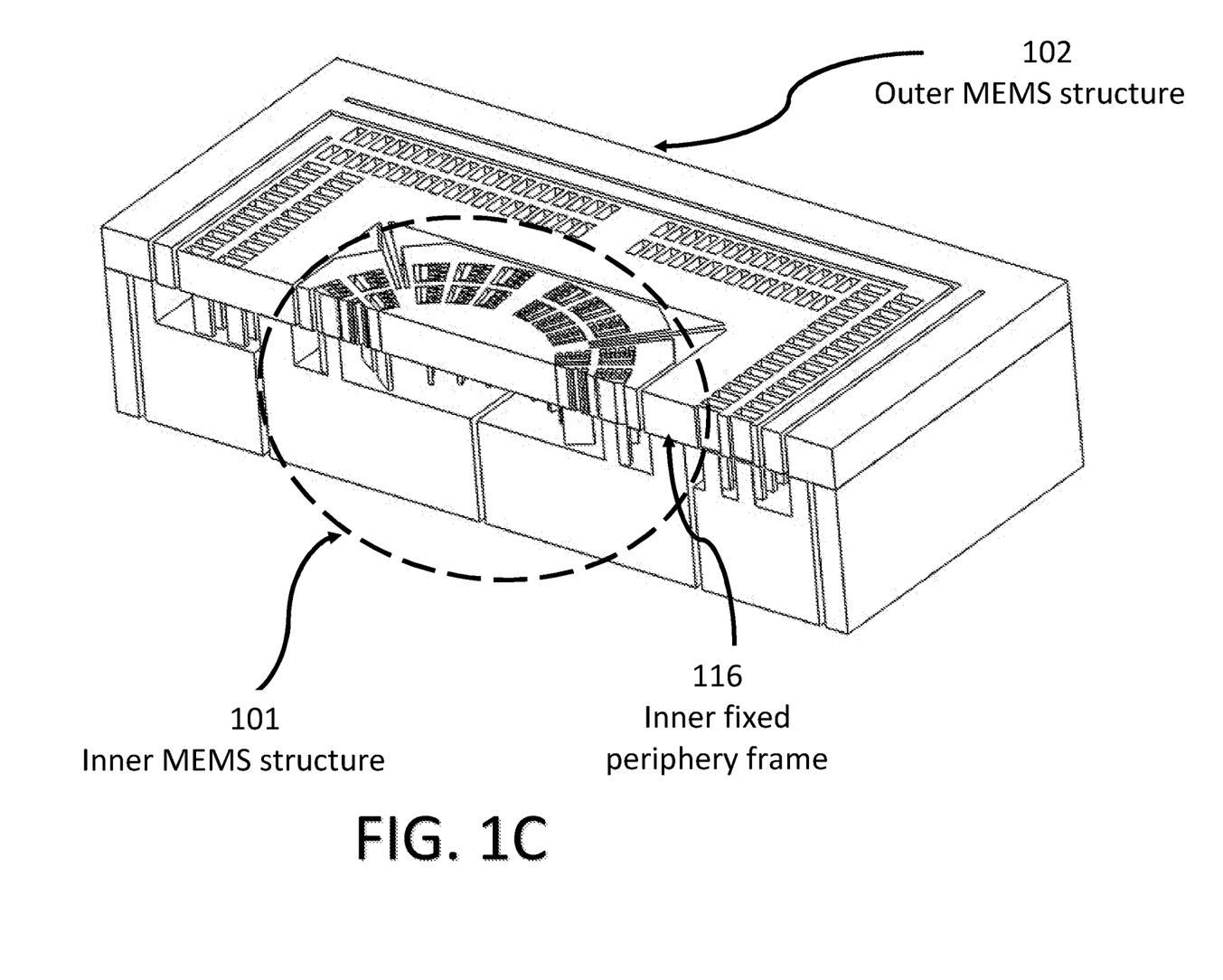
FIG. 1C shows a cross-sectional perspective view of the 4-DOF MEMS piston-tube electrostatic actuator illustrating the inner and outer MEMS structures.
Figure 1D:
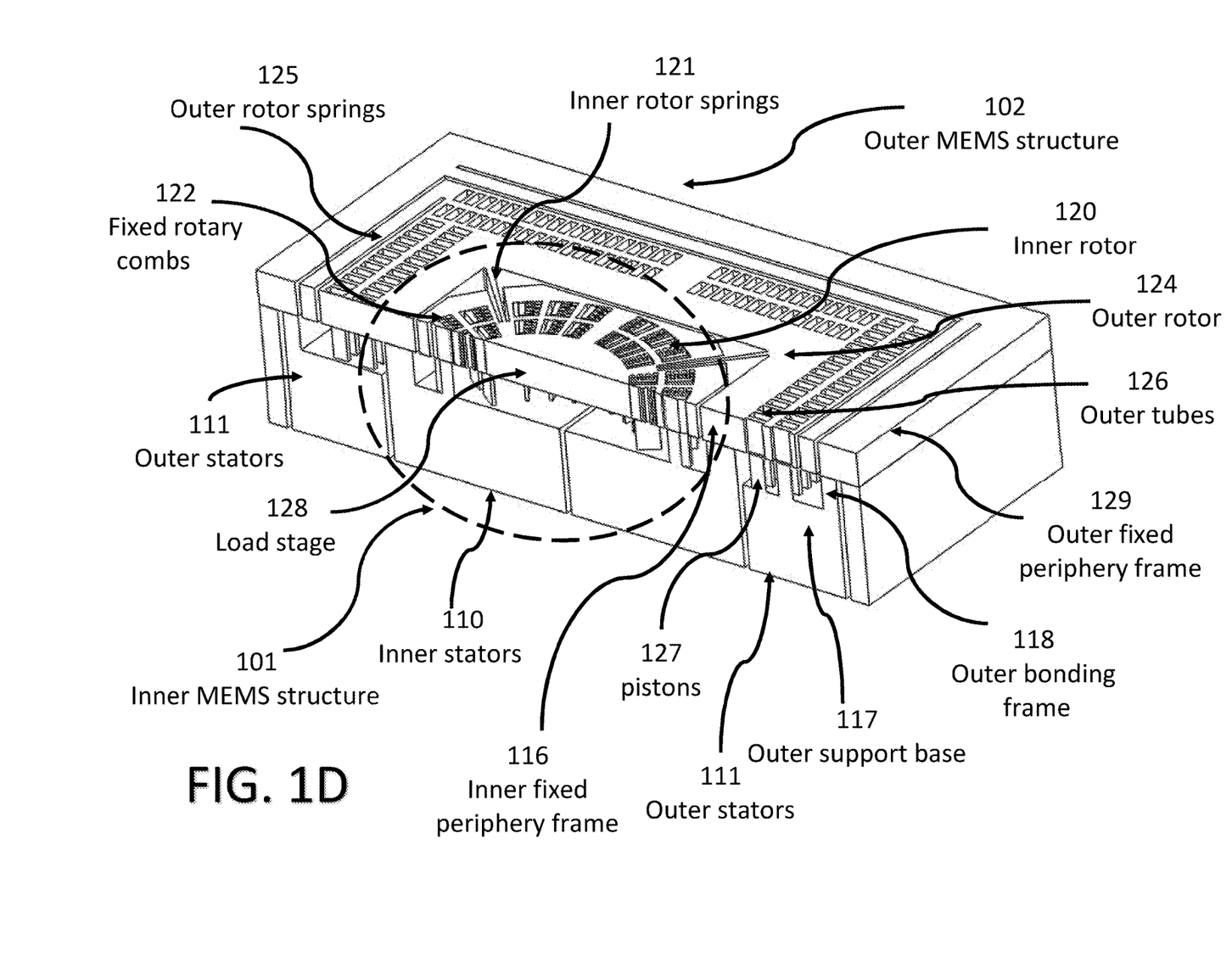
FIG. 1D shows a cross-sectional perspective view of the 4-DOF MEMS piston-tube electrostatic actuator illustrating different parts of the actuator.

The 4-DOF MEMS electrostatic piston-tube actuator 100 is illustrated in FIG. 1A-D. The actuator is made of two bonded Si plates, i.e. lower 103 and upper 104, refer to FIG. 1F. Each plate contains moving parts (rotors) and stationary parts (stators). The actuator mainly consists of two structures, i.e. inner 101 and outer 102, see FIG. 1C. The inner MEMS structure of the actuator provides 1-DOF motion, i.e. roll (rotation about the z-axis). The outer MEMS structure of the actuator provides 3-DOF motion, i.e. yaw (rotation about the x-axis), pitch (rotation about the y-axis), and translation along the z-axis. The motion between both structures is totally decoupled. Each structure uses parts of the lower and the upper Si plates.

Figure 3A:
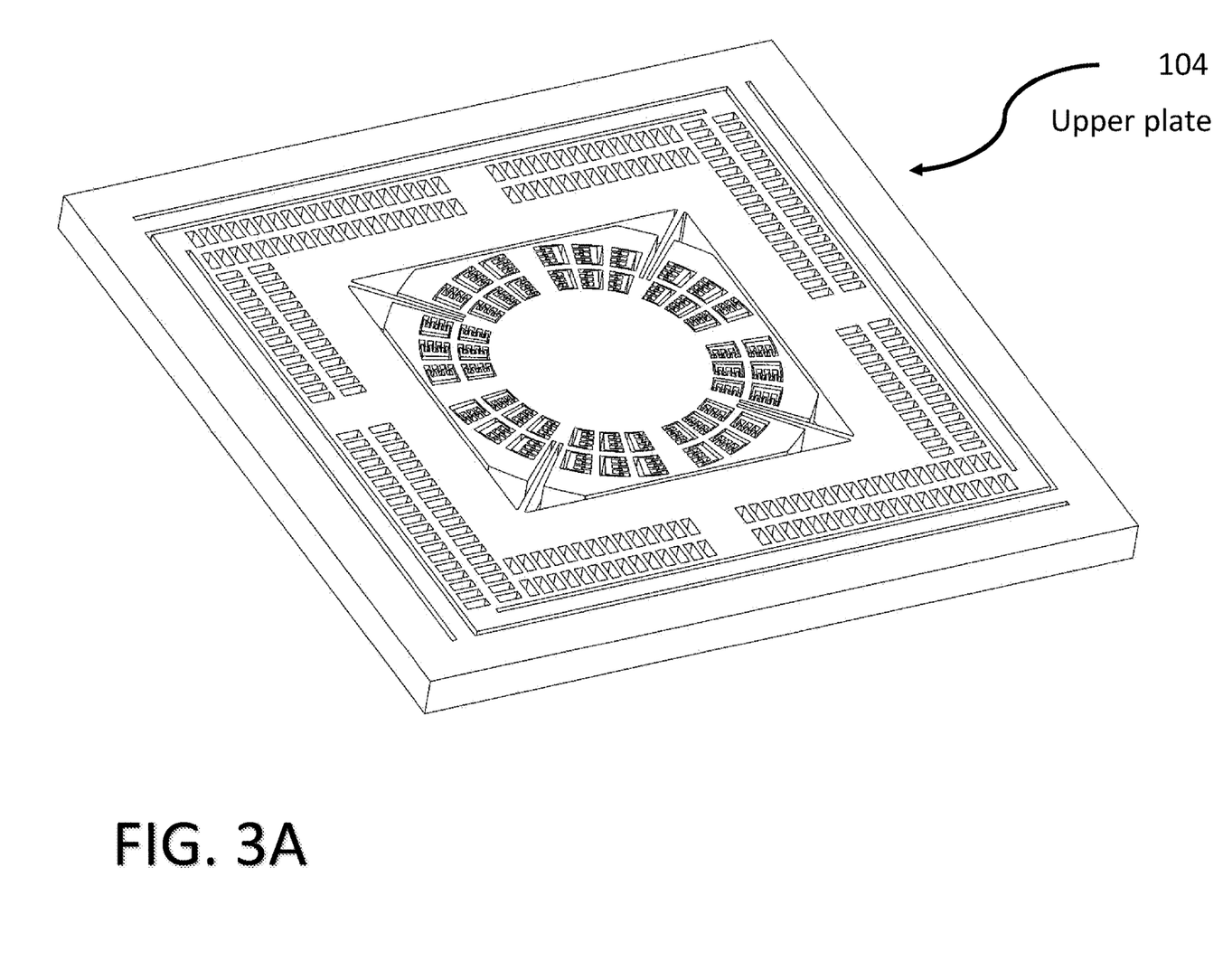
FIG. 3A illustrates a perspective view of the moving parts (rotors) of the both inner and outer MEMS structures of the 4-DOF MEMS piston-tube electrostatic actuator.
Figure 3B:
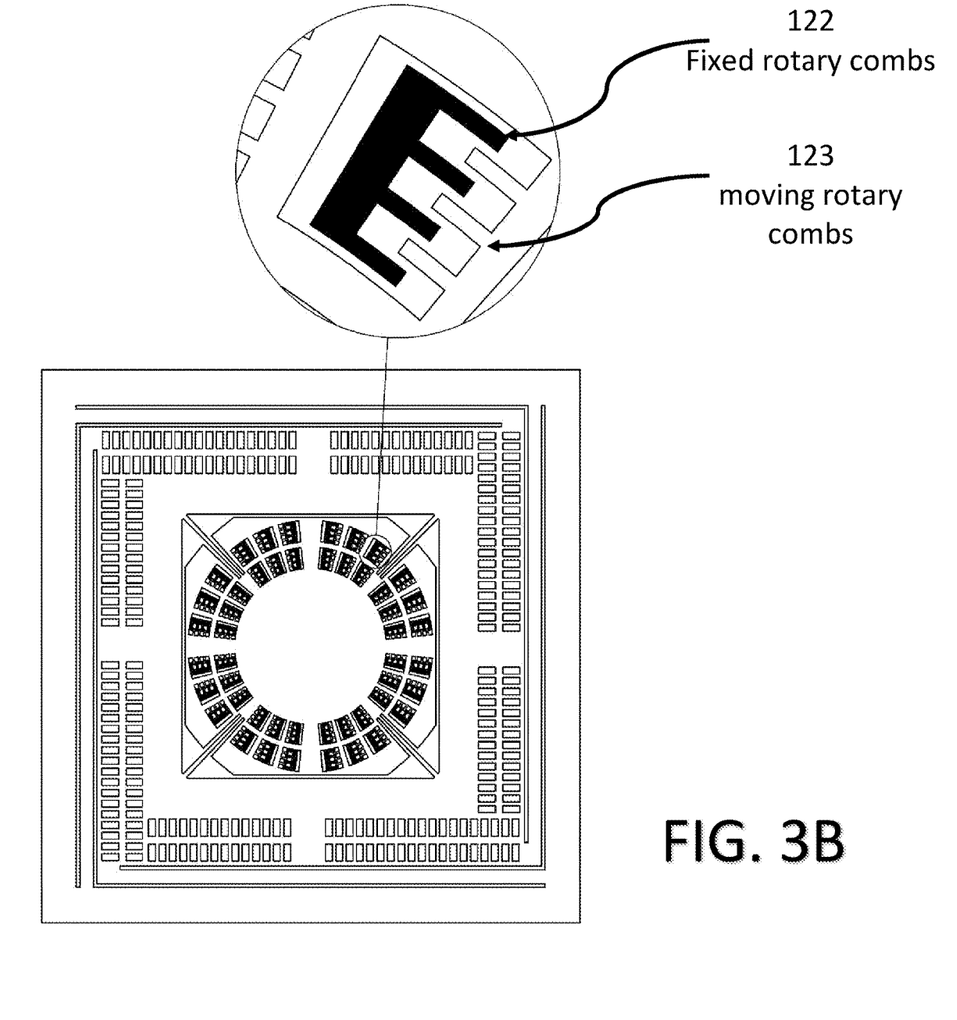
FIG. 3B is top and detailed views illustrating the moving parts (rotors) of the both inner and outer MEMS structures of the 4-DOF MEMS piston-tube electrostatic actuator, and the fixed rotary combs that are attached to the inner stators.

The inner MEMS structure consists of an inner moving stage (inner rotor 120) and an inner fixed frame (inner stators 110). The inner rotor consists of a central load stage 128 and a plurality of moving rotary comb-drives 123, refer to FIG. 3A-B, that rotates the load stage about the z-axis. The inner rotor is connected to an inner fixed periphery frame 116 via a plurality of mechanical springs 121. The rotor has a ribbed (meshed) structure in which each moving comb is rigidly attached to it from two ends. Such ribbed structure of the rotor makes it resistant to sudden shock forces that ensure from falls and drops the actuator may experience. The ribbed structure of the rotor also allows multiplying the number of the comb-drives along x-y plane such that a wide capacitive area could be utilized to generate large forces. One with ordinary skills in the art can notice that the electrostatic forces generated between the rotary comb-drives are directly applied to the load stage such that no reduction in the force occurs during the transmission of the force. Such reduction could be seen in other designs where mechanical springs are placed between the driving electrodes and the load stage. The mechanical springs that holds the inner rotor guide the motion and allow it in only one direction, i.e. rotation about the z-axis, while resisting the motion in other degrees of freedom as the springs are very stiff in the other directions.

Figure 7:
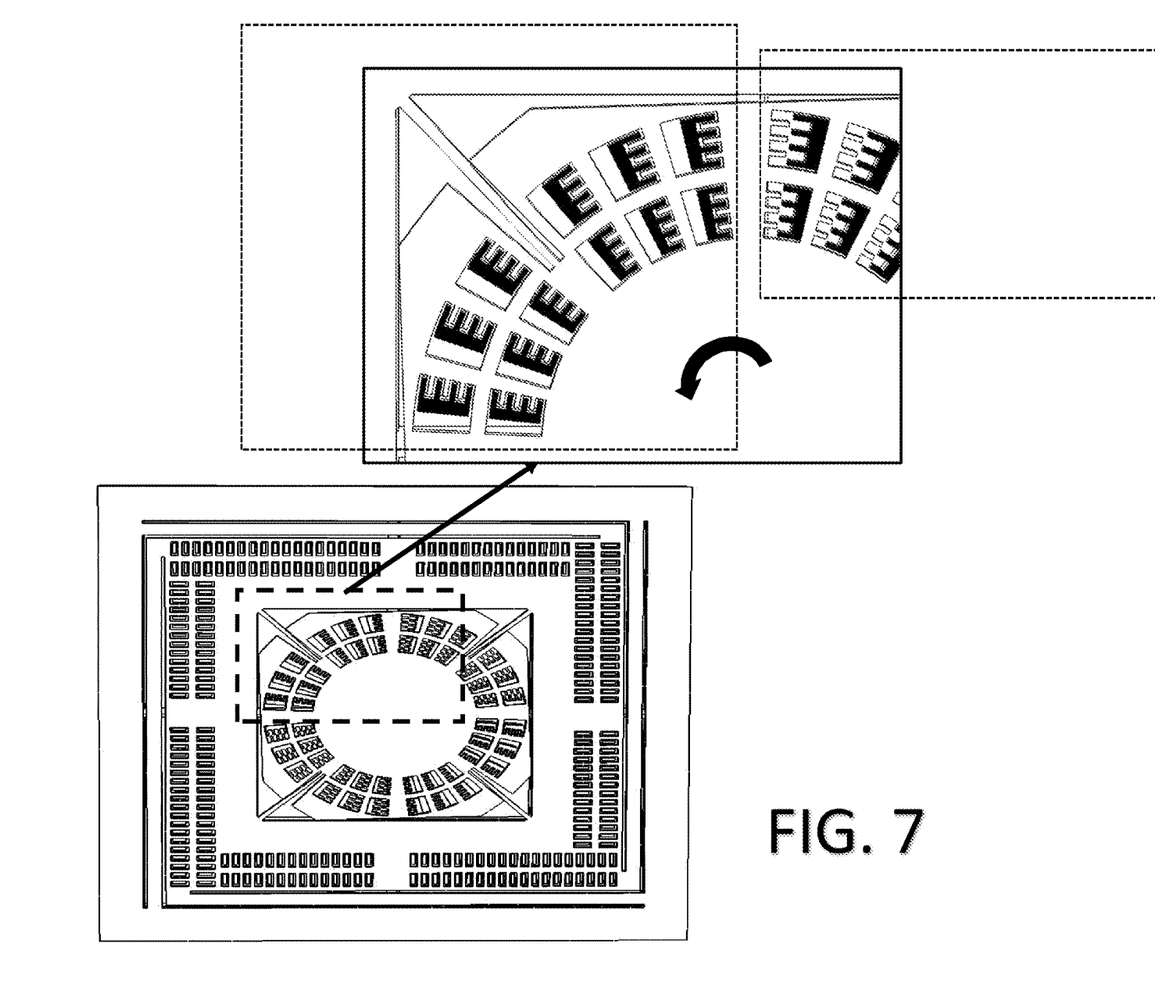
FIG. 7 shows a top view of the 4-DOF MEMS piston-tube electrostatic actuator while the inner rotor of the actuator provides roll motion about the z-axis.

The fixed part of the inner MEMS structure consists of the four inner stators 110. Each stator, refer to FIG. 1E, consists of a support base 113, plurality of vertical support columns 114, and fixed rotary combs 122. The vertical support columns are used to provide a mechanical support and electrical routing to the fixed rotary combs. All of the fixed rotary combs within one stator are electrically connected to each other. Each inner stator is electrically separated from other inner stators via electrical separation trenches 132 (see FIG. 1B) using Deep Reactive Ion Etching (DRIE) in the lower plate. In one embodiment of the present invention, each pair of two opposing inner stators could have the same electrical polarity, such that when a voltage signal is applied across each pair of opposing stators and the corresponding arrays of the moving rotary combs in the inner rotor, an electrostatic torque is generated, thus rotating the load stage about the z-axis, refer to FIG. 7.

Figure 1E:
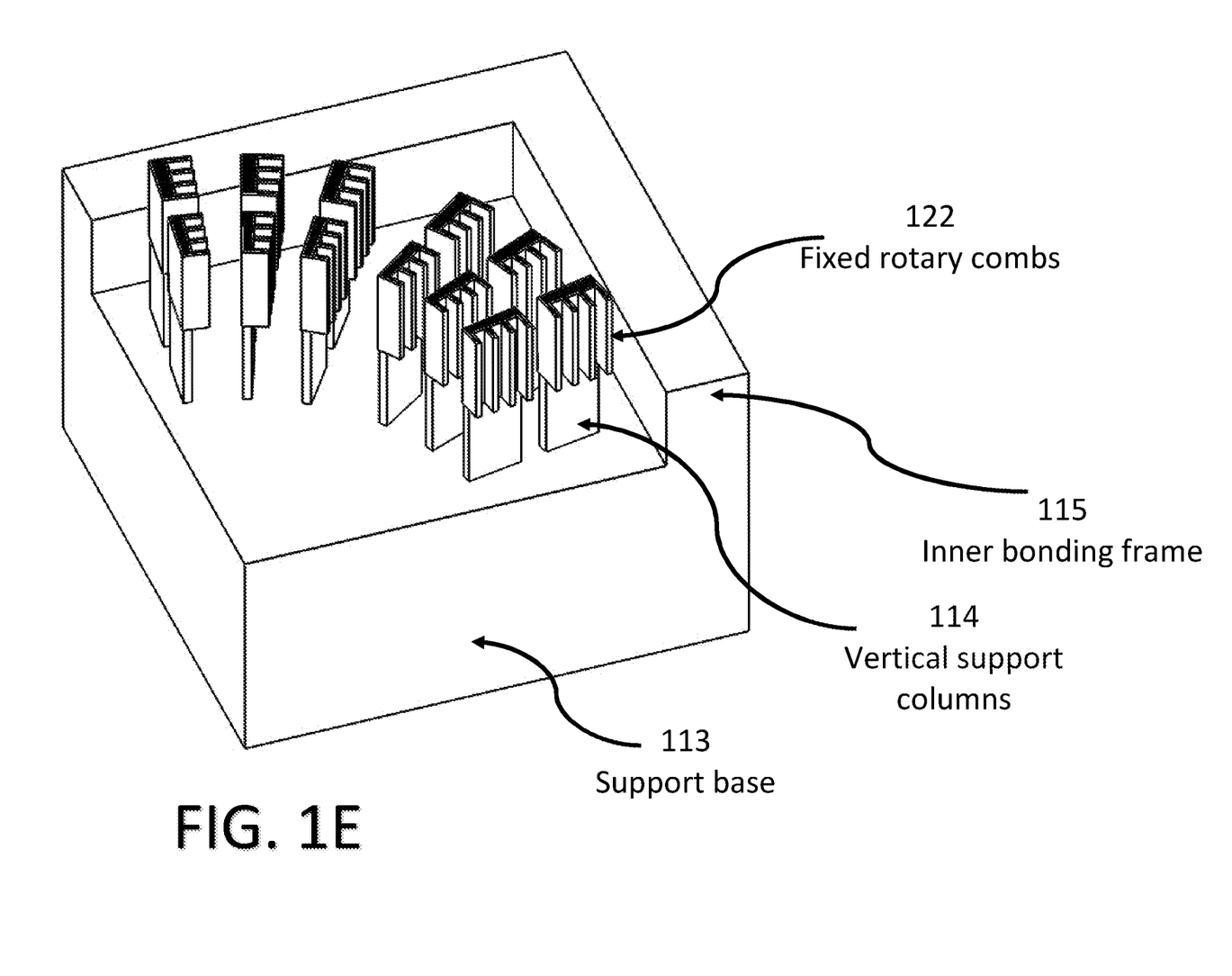
FIG. 1E shows a perspective view of a single inner stator of the 4-DOF MEMS piston-tube electrostatic actuator.
Figure 1F:
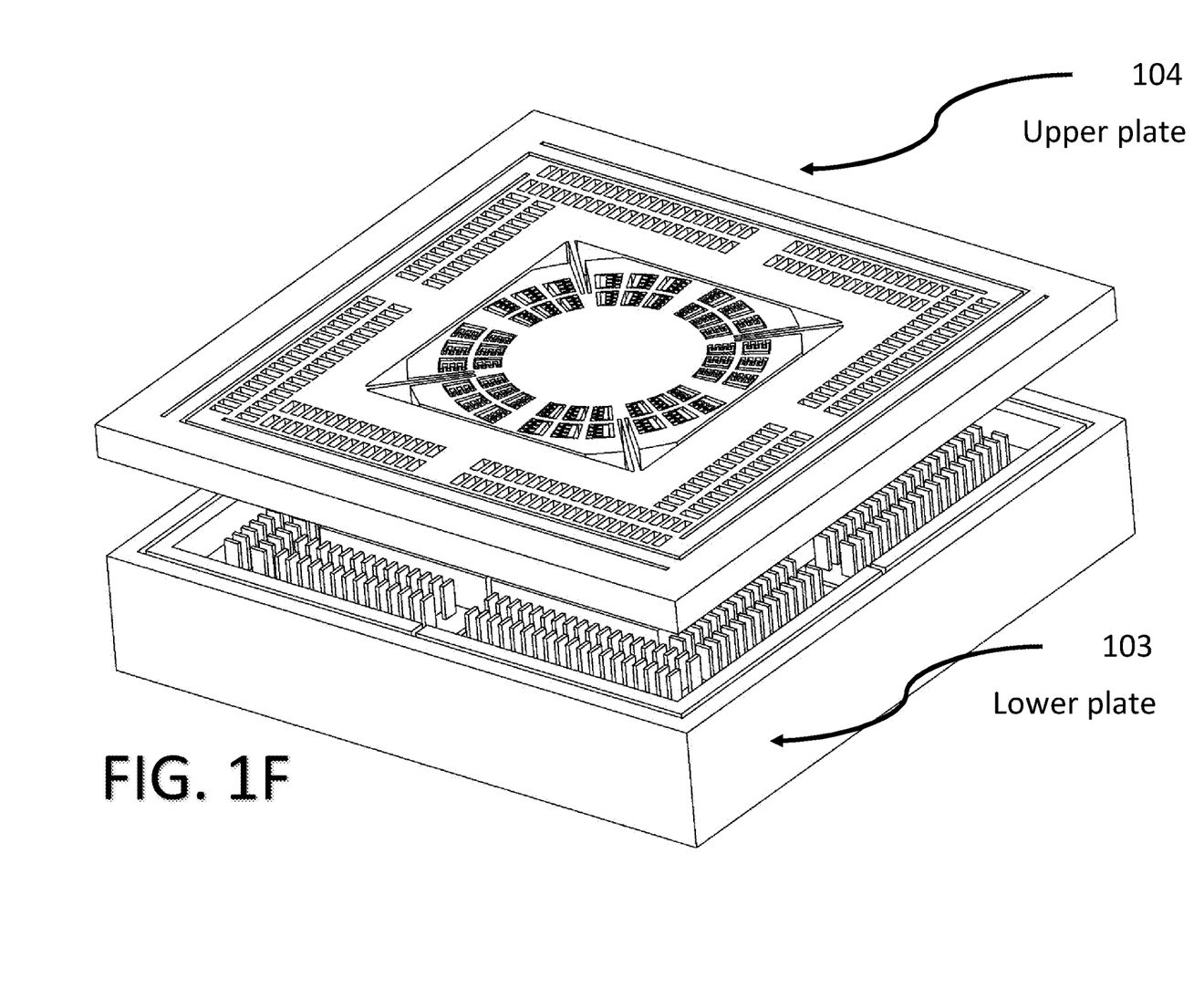

As it could be seen in FIG. 1E that the fixed rotary combs are fabricated from the thickness of the upper plate 104, but are mechanically isolated from the inner rotor using DRIE trenches of the upper plate 104. Because this DRIE-isolated fixed rotary combs are supported and bonded to the vertical columns from the bottom side, they become rigidly attached to the inner stator and part of it. The drawings show only two circular rows of rotary combs for illustration purposes, but it can be readily apparent to the one who skilled in the art that a large number of rows of rotary combs can be utilized to increase the electrostatic force while keeping the mechanical rigidity of the structure.

Figure 2A:
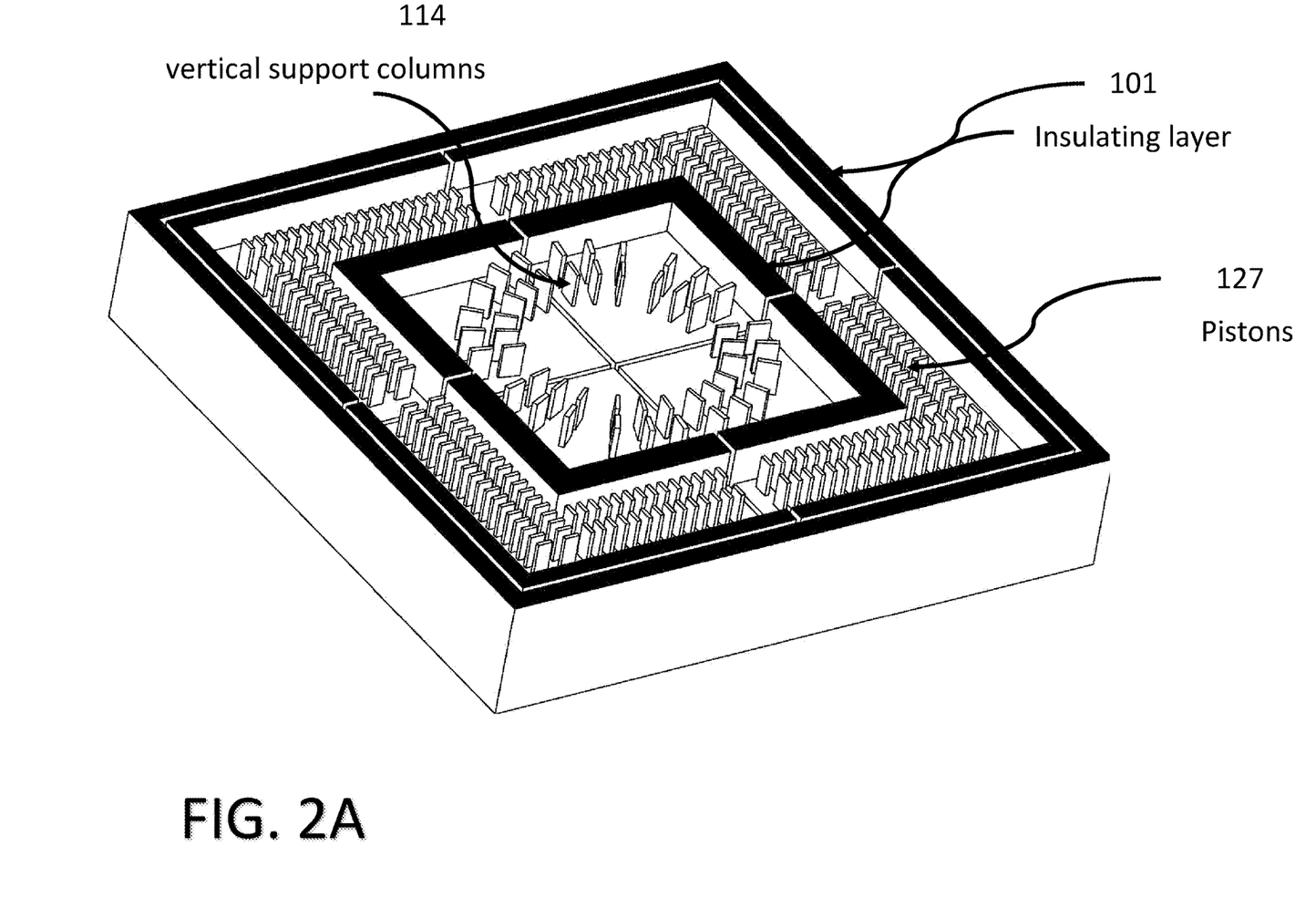
FIG. 2A illustrates a perspective view of the eight stators of the inner and outer MEMS structures of the 4-DOF MEMS piston-tube electrostatic actuator.

The support base 113 of the inner stator is rigidly attached to the outer MEMS structure through an inner bonding frame 115 that is covered with an insulating layer 101 shown in FIG. 2A. The insulating layer can be an oxide layer. This layer provides an electrical insulation between the inner stators and the outer MEMS structure.

The outer MEMS structure 102 of the 4-DOF piston-tube actuator, shown in FIG. 1D, consists of an outer rotor 124 and four outer stators 111. The outer rotor holds the entire inner MEMS structure 101 as it is bonded to the rotor through the inner fixed periphery frame 116. This outer rotor is attached to the outer fixed periphery 129 of the actuator via a number of mechanical springs 125. The outer rotor contains a plurality of the through openings vertically etched through the upper plate and they are referred to as tubes 126. The outer rotor has a very high mechanical rigidity which is attributed to its ribbed (meshed) structure.

Figure 2B:
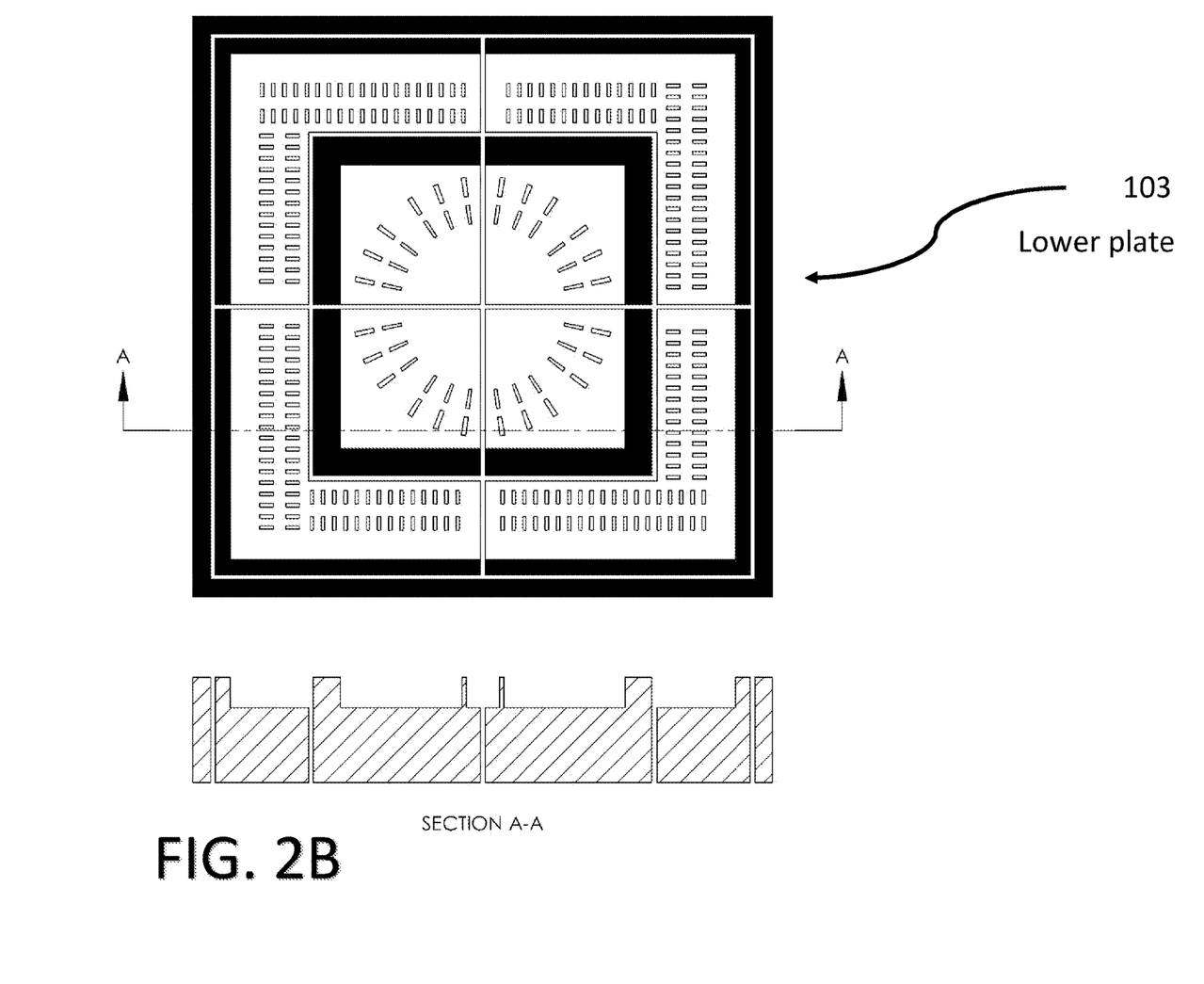
FIG. 2B is a top view illustrating the eight stators of the inner and outer MEMS structures of the 4-DOF MEMS piston-tube electrostatic actuator.

The four outer stators 111 in the outer MEMS structure are electrically insulated from each other via back DRIE electrical separation trenches 132 throughout the lower plate, refer to FIG. 1B. Each stator contains a plurality of vertically protruding pillars, referred to as pistons 127. The pistons are supported by a support base 117 that is attached to the outer fixed periphery frame 129 of the actuator through an outer bonding frame 118 that is covered with an insulating layer 101 shown in FIG. 2A-B (it could be an oxide layer). Such layer provides an electrical insulation between the outer periphery frame and the four outer stators.

Figure 4A:
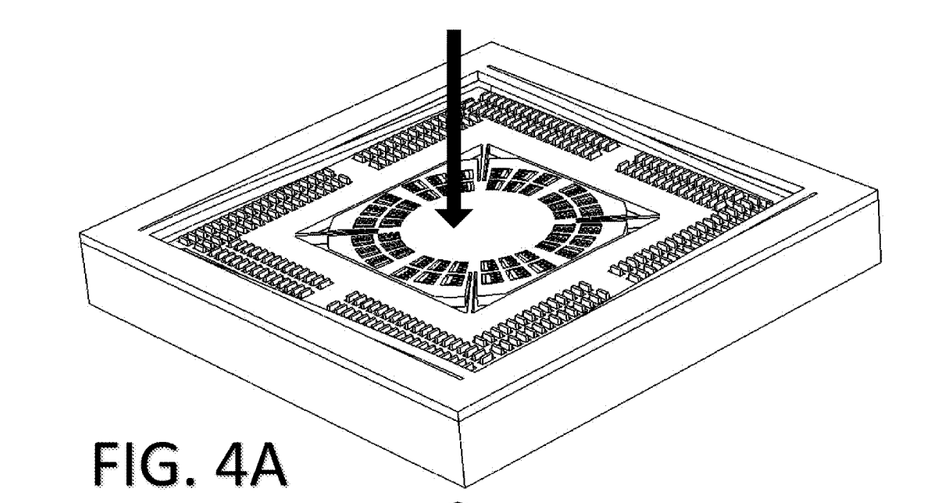
FIG. 4A shows a perspective view of the 4-DOF MEMS piston-tube electrostatic actuator when the outer rotor of the actuator provides a translation motion along the z-axis.
Figure 4B:
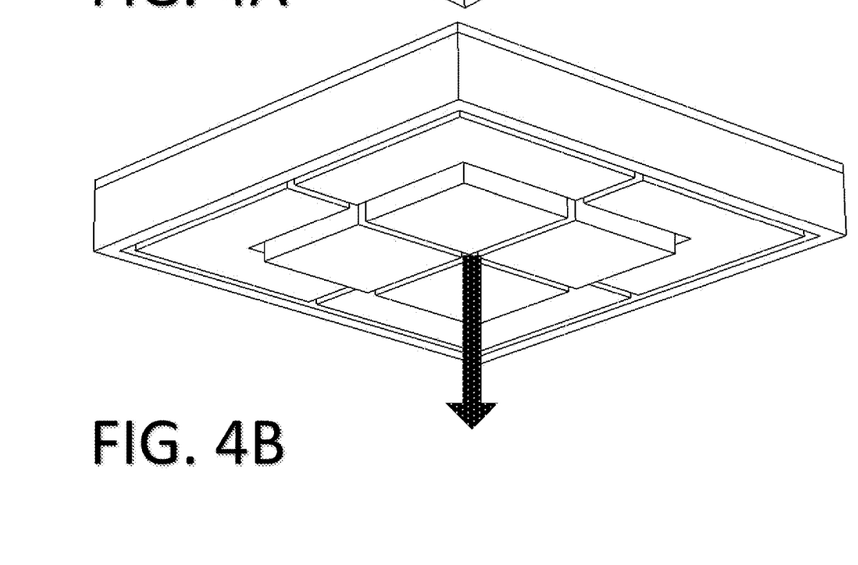
FIG. 4B shows a perspective view of the bottom side of the 4-DOF MEMS piston-tube electrostatic actuator while the outer rotor of the actuator provides a translation motion along the z-axis.
Figure 5A:
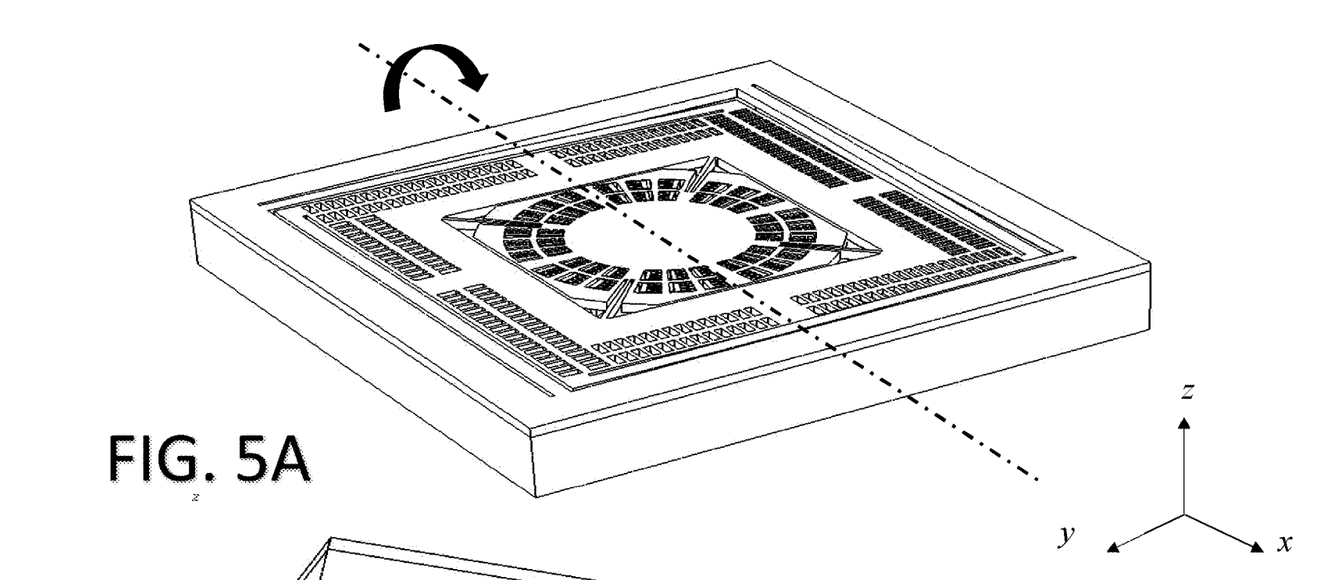
FIG. 5A shows a perspective view of the 4-DOF MEMS piston-tube electrostatic actuator while the outer rotor of the actuator provides yaw motion, i.e. rotation about the x-axis.
Figure 5B:
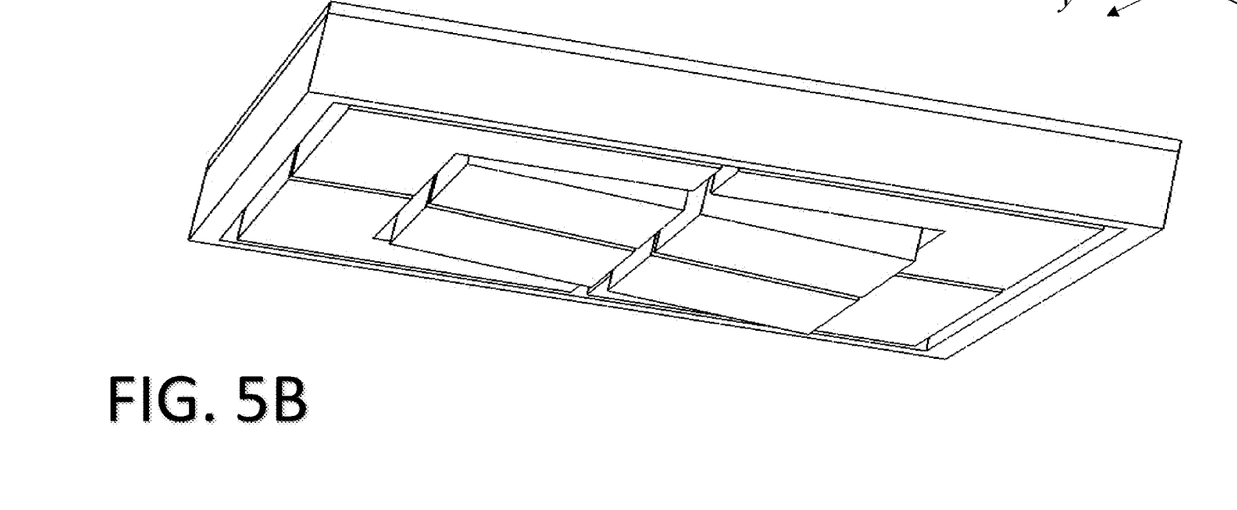
FIG. 5B shows a perspective view of the bottom side of the 4-DOF MEMS piston-tube electrostatic actuator while the outer rotor of the actuator provides yaw motion, i.e. rotation about the x-axis.
Figure 6A:
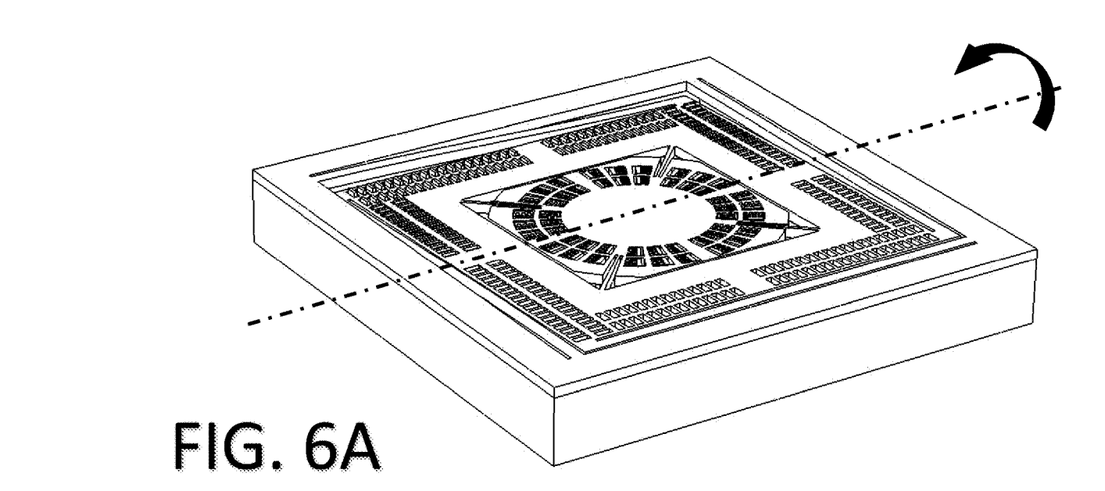
FIG. 6A shows a perspective view of the 4-DOF MEMS piston-tube electrostatic actuator while the outer rotor of the actuator provides pitch motion, i.e. rotation about the y-axis.
Figure 6B:
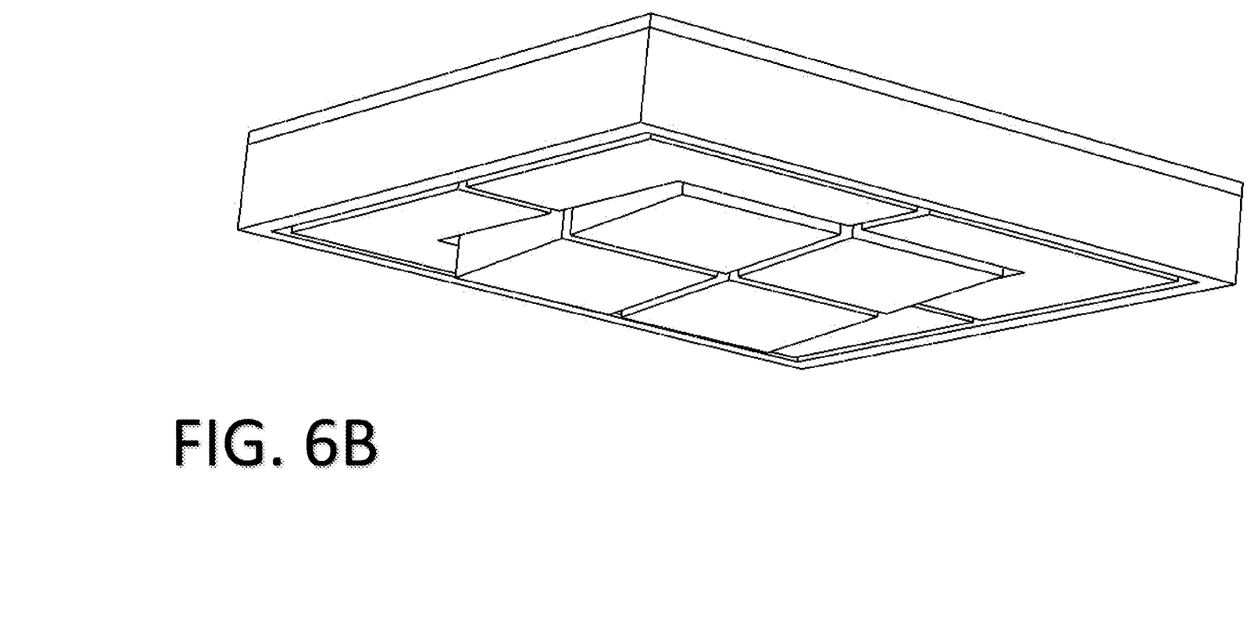
FIG. 6B shows a perspective view of the bottom side of the 4-DOF MEMS piston-tube electrostatic actuator while the outer rotor of actuator provides pitch motion, i.e. rotation about the y-axis.

When a voltage is applied across all/some of the outer stators and the outer rotor, an electrostatic force/torque is generated between the inner walls of the tubes in the outer rotor and the walls of the pistons in the outer stators. This force or torque drives the entire inner MEMS structure (containing the load) in a 3-DOF motion, i.e. yaw (rotation about the x-axis), refer to FIG. 5A-B, pitch (rotation about the y-axis), refer to FIG. 6A-B, and translation along the z-axis, refer to FIG. 4A-B. Thus, the load on the central stage of the actuator experiences 4-DOF motion that are provided by the actuator.

The actuator could be used to move the image sensor within camera modules in 4-DOF motion such that it compensate for the pitch, yaw and roll motion of the handshake of the user as well as moving along the z-axis to achieve AF. In such camera module design, the optical lens barrel is preferred to have another actuator such that it moves in yaw and pitch directions simultaneously with the image sensor to keep the image sensor plane parallel to the lens barrel plane. The actuator could also be used only to achieve OIS by rotating the entire camera module in yaw, pitch, and roll directions which is one of the best methods to achieve OIS in cameras.

It could be apparent to the one with the ordinary skills in the art that the current invention could be altered in many ways without the departure from the soul of the present invention. For example, one may alter between the position of the inner and the outer MEMS structures such that the inner MEMS structure contains the piston-tube electrode configuration, and the outer MEMS structure contains the rotary comb-drive configuration. Thus, the inner MEMS structure will provide 3-DOF motion, i.e. yaw, pitch, and z-axis translation, while the outer MEMS structure only provides 1-DOF motion (roll, rotation about the z-axis). Therefore, the load on the actuator will move in 4-DOF motion. One also may use one or two inner stators in the inner MEMS structure instead of four, and still the inner rotor will provide roll motion. One may use 3 or more outer stators to generate 3-DOF motion by the outer rotor instead of four stators.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

With respect to the above description, it is to be realized that the optimum relationships for the parts of the invention in regard to size, shape, form, materials, function and manner of operation, assembly and use are deemed readily apparent and obvious to those skilled in the art, and all equivalent relationships to those illustrated in the drawings and described in the specification are intended to be encompassed by the present invention.

What is claimed is:

1. A 4 Degrees of Freedom (4-DOF) MEMS piston-tube microactuator, comprising:
   a) an inner MEMS structure, comprising:
      i) an inner moving stage having a central load stage, and an array of inner-tubes having an inner-wall and surrounding said central load stage, and the inner moving stage defining an x and y axes and a x-y plane, and a z-axis being normal to the x-y plane, wherein said array of inner-tubes are spaced apart and through tubes, and wherein each inner-tube has a plurality of moving-rotary-comb-fingers extending outwardly along the x-y plane from the inner-wall of each inner-tube, wherein said array of inner-tubes and said central load stage are attached through a set of mechanical springs to an inner-fixed periphery-frame,
      ii) inner-stators are electrically insulated from each other, wherein each said inner-stator comprises of a bonding frame, a support base, and a plurality of support columns extending along the z-axis and are attached to said support base, said bonding frame mechanically connects each inner-stator to said inner-fixed-periphery-frame, each of the support columns holds a set of fixed-rotary-comb fingers sized and shaped to interdigitate with each said moving-rotary-comb-finger in said inner moving stage during actuation, wherein said fixed-rotary-comb-fingers within each said inner stator are electrically connected through said support columns, whereby in presence of a voltage potential between the inner stators and the inner moving stage, an electrostatic torque is generated and the central load stage is rotated in a bi-directional roll motion about the z-axis,
   b) an outer MEMS structure, comprising:
      i) an outer moving stage rigidly holding said inner MEMS structure through said inner-fixed-periphery-frame and having an array of spaced apart outer-tubes, the walls of said outer-tubes being electrically connected to each other, wherein said outer moving stage or outer rotor is attached to an outer fixed periphery by a plurality of outer rotor mechanical springs,
      ii) outer stators, wherein each said outer stator comprises of an outer-support base, an outer-bonding frame, and a plurality of arrays of pistons extending upward along the z-axis and supported by said outer-support base, wherein the pistons in each said outer stator being electrically connected to each other, and each said outer stator is electrically insulated from other outer stators and is electrically addressable, whereby in presence of a difference potential across the pistons and the tubes, said outer moving fame moves along the z-axis, rotates in a yaw motion about the x-axis, and rotates on a pitch motion about the y-axis, and whereby a load on the central load stage experiences four degrees of freedom motion, comprising rotations about the x, y, z axes and translation along the z-axis.

2. The 4-DOF MEMS piston-tube microactuator of claim 1, wherein said inner-fixed-periphery-frame of the inner MEMS structure is mechanically decoupled from said outer fixed frame of the outer MEMS structure through back etching.

3. The 4-DOF MEMS piston-tube microactuator of claim 1, wherein said plurality of inner stators are electrically separated from each other through Deep Reactive Ion Etching (DRIE etching).

4. The 4-DOF MEMS piston-tube microactuator of claim 1, wherein said plurality of inner stators are electrically separated from each other through an insulating layer of SOI wafer.

5. The 4-DOF MEMS piston-tube microactuator of claim 1, wherein said plurality of outer stators are electrically separated from each other through Deep Reactive Ion Etching (DRIE etching).

6. The 4-DOF MEMS piston-tube microactuator of claim 1, wherein said plurality of outer stators are electrically separated from each other through an insulating layer of SOI wafer.

7. The 4-DOF MEMS piston-tube microactuator of claim 1, wherein said inner moving stage having a rotary comb drives, where each rotary comb drive comprises of a support frame that is attached to the load stage from one end and free from the other end, each support frame holds a plurality of rotary comb fingers.

8. The 4-DOF MEMS piston-tube microactuator of claim 1, wherein said outer tubes in said outer moving stages are square, rectangular, circular, pentagonal, hexagonal or other geometrical defined shapes.

9. The 4-DOF MEMS camera module of claim 1, wherein an image sensor is attached to the load stage, said load stage moves the image sensor in 3 rotational motion about the x, y, and z axes and a translational motion along the z-axis.

10. The 4-DOF MEMS camera module of claim 1, wherein a camera module is attached to the load stage, said load stage moves an image sensor in 3 rotational motions about the x, y, and z axes and a translational motion along the z-axis.

11. The 4-DOF MEMS camera module of claim 1, wherein said central load stage is an optical load or a camera module.

* * * * *